(12) United States Patent
Matsuda

(10) Patent No.: US 6,396,215 B1
(45) Date of Patent: May 28, 2002

(54) ION-IMPLANTATION APPARATUS AND METHOD OF ION-IMPLANTATION BY USE OF THIS APPARATUS

(75) Inventor: Hiroo Matsuda, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/667,568

(22) Filed: Sep. 21, 2000

(30) Foreign Application Priority Data

Sep. 29, 1999 (JP) .......................................... 11-277051

(51) Int. Cl.⁷ .................................................. H01J 7/24
(52) U.S. Cl. ............................. 315/111.81; 315/111.91; 250/492.21; 250/441.11
(58) Field of Search ...................... 315/111.81, 111.91; 250/492.21, 441.11; 118/725

(56) References Cited

U.S. PATENT DOCUMENTS

| | | | | |
|---|---|---|---|---|
| 3,778,626 A | * | 12/1973 | Robertson | .................... 250/492 |
| 5,314,541 A | * | 5/1994 | Saito et al. | .................. 118/725 |
| 5,672,882 A | * | 9/1997 | Day et al. | .............. 250/492.21 |

FOREIGN PATENT DOCUMENTS

| | | |
|---|---|---|
| EP | 0 537 379 | 4/1993 |
| JP | 5-221793 | 8/1993 |

* cited by examiner

*Primary Examiner*—Haissa Philogene
(74) *Attorney, Agent, or Firm*—Young & Thompson

(57) ABSTRACT

An ion-implantation apparatus includes a chamber and a pressure controller for maintaining an internal pressure of the chamber at not less than 1E-4 Torr during an ion-implantation process.

8 Claims, 2 Drawing Sheets

ION-IMPLANTATION APPARATUS AND METHOD OF ION-IMPLANTATION BY USE OF THIS APPARATUS

BACKGROUND OF THE INVENTION

The present invention relates to an ion-implantation apparatus and a method of ion-implantation by use of this apparatus, and more particularly to an ion-implantation apparatus capable of suppressing a shift of an ion-implantation amount due to an out gas from a resist over a wafer and a method of ion-implantation by use of this apparatus.

FIG. 1 is a schematic cross sectional view illustrative of a conventional ion-implantation apparatus. The conventional ion-implantation apparatus has the following elements. A chamber 1 is provided which accommodates a semiconductor wafer 2 over which a resist is provided. A pressure gage 5 is also provided on the chamber 1 for measuring an internal pressure of the chamber 1. A dose counter 6 is also provided in the chamber 1 for receiving an ion-beam 3 and measuring a dose of the ion-beam 3.

If the ion-beam 3 is irradiated onto the resist over the semiconductor wafer 2, then an out-gas from the resist neutralizes or ionizes the ion-beam 3, whereby an amount of the ion-implantation is shifted from when the ion-beam 3 is irradiated onto the semiconductor wafer free of resist.

It is necessary to maintain the measurement to the internal pressure of the chamber by the vacuum gage during the ion-implantation process for the purpose of making a real time calculation of the neutralization or ionization of the ion-beam 3 so as to correct the amount of ion-implantation. The neutralization or ionization of the ion-beam 3 varies depending upon the kinds of ion, the beam current, the ion-implantation energy, and the resist material, for which reason the calculation of the neutralization or ionization of the ion-beam 3 are needed for every times.

In the above circumstances, it had been required to develop a novel ion-implantation apparatus and a method of ion-implantation by use of this apparatus free from the above problem.

SUMMARY OF THE INVENTION

Accordingly, it is an object of the present invention to provide a novel ion-implantation apparatus free from the above problems.

It is a further object of the present invention to provide a novel ion-implantation apparatus capable o:f suppressing the shift of the ion-implantation when the ion-beam is irradiated onto the resist over the semiconductor wafer.

It is a still further object of the present invention to provide a novel method of ion-implantation free from the above problems.

It is yet a further object of the present invention to provide a novel method of ion-implantation for suppressing the shift of the ion-implantation when the ion-beam is irradiated onto the resist over the semiconductor wafer.

The present invention provides an ion-implantation apparatus comprising: a chamber; and a pressure controller for maintaining an internal pressure of the chamber at not less than 1E-4 Torr during an ion-implantation process.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1:
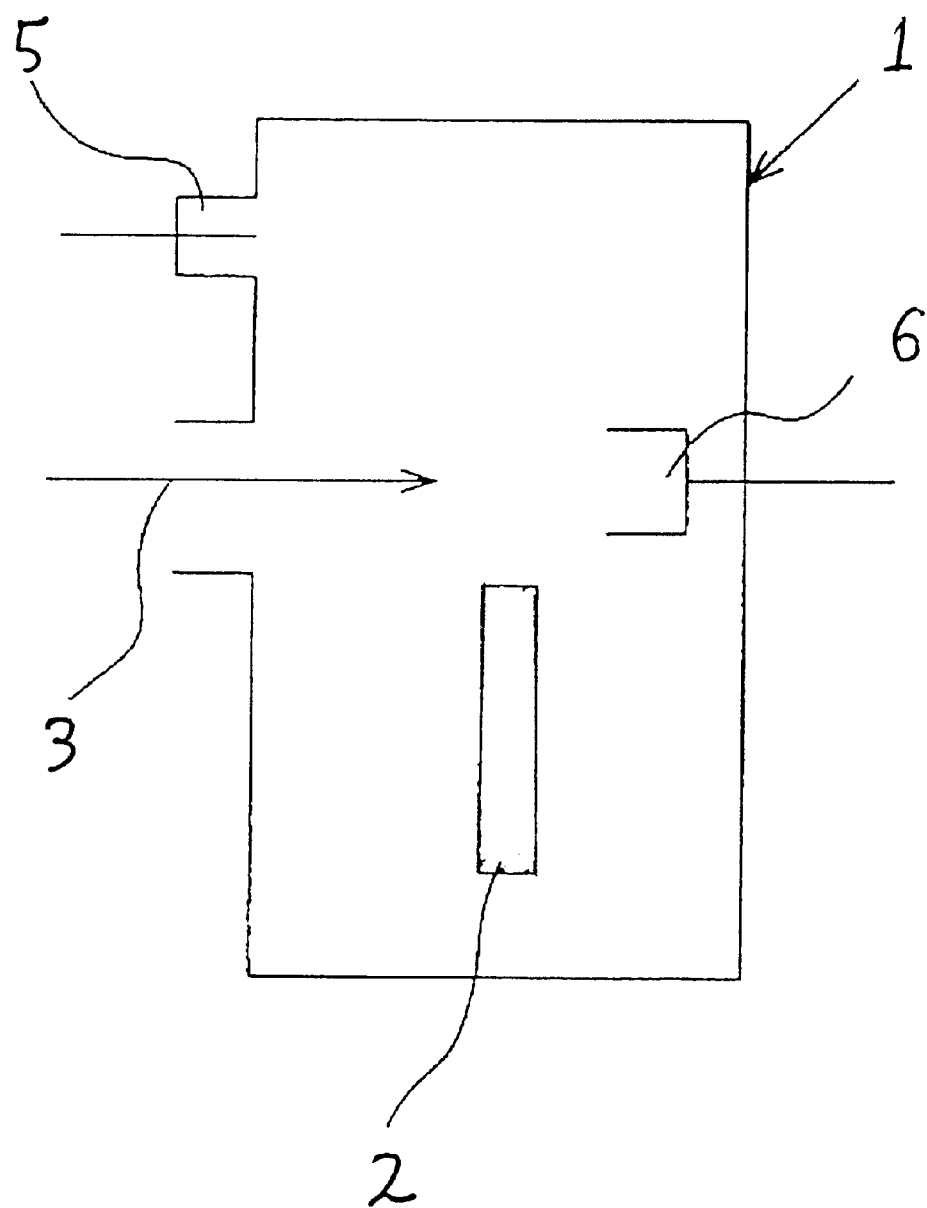
FIG. 1 is a schematic cross sectional view illustrative of a conventional ion-implantation apparatus.

The first present invention provides an ion-implantation apparatus comprising: a chamber; and a pressure controller for maintaining an internal pressure of the chamber at not less than 1E-4 Torr during an ion-implantation process.

It is preferable that the pressure controller maintains the internal pressure in the range of 1E-4 Torr to 1E-1 Torr.

It is also preferable that the pressure controller further comprises: a pressure gage for measuring the internal pressure; and an inert gas supplying system for supplying an inert gas into the chamber.

The second present invention provides an ion-implantation apparatus comprising a chamber; a dose counter for measuring a dose of an ion-beam; a pressure gage for measuring an internal pressure of the chamber; and an inert gas supplying system for supplying an inert gas into the chamber so as to maintain an internal pressure of the chamber in the range of 1E-4 Torr to 1E-1 Torr during an ion-implantation process.

The third present invention provides a method of ion-implantation by maintaining an internal pressure of a chamber at not less than 1E-4 Torr during an ion-implantation process.

It is preferable that the internal pressure is maintained in the range of 1E-4 Torr to 1E-1 Torr.

It is also preferable that an inert gas is supplied into the chamber to maintain the internal pressure at not less than 1E-4 Torr.

A relationship between an effective dose of an ion-beam of an ion-implantation and a measured dose of the ion-beam of the ion-implantation is given by the following equation.

$$Io = I \times F(C, P)$$

where Io is the effective dose of an ion-beam of an ion-implantation, I is the measured dose of the ion-beam of the ion-implantation, P is the internal pressure of the chamber of the ion-implantation apparatus, and C is the correction coefficient, and F(C, P) is the function of C and P.

In accordance with the conventional ion-implantation method, the chamber pressure P is maintained at about 1E-6 Torr, when the ion-implantation is carried out to the resist-free semiconductor wafer. The chamber pressure P is, however, maintained at about 1E-5 Torr, when the ion-implantation is carried out to the semiconductor wafer formed with the resist. The chamber pressure P for ion-implantation to the resist-free semiconductor wafer is higher by about ten times than the chamber pressure P for ion-implantation to the semiconductor wafer formed with the resist. For this reason, the correction coefficient has already been found for defining the correspondence between the effective dose Io and the measured dose I. The chamber pressure varies depending upon the kinds of ion, the beam current, the ion-implantation energy, and the resist material. For this reason, it is necessary to calculate the correction coefficient every times.

In accordance with the present invention, the internal pressure of the chamber is maintained at not less than 1E-4 Torr. For example, if the ion-implantation is carried out to the resist-free semiconductor wafer, then the internal pressure of the chamber is maintained at 1.01E-4 Torr. If the ion-implantation is carried out to the semiconductor wafer provided with the resist, then the internal pressure of the chamber is maintained at 1.1E-4 Torr. A difference in the internal pressure of the chamber between when the ion-implantation is carried out to the resist-free semiconductor wafer and when the ion-implantation is carried out to the semiconductor wafer provided with the resist is extremely small, for example, 0.1E-4 or about 0.1 times. The shift is to compensate this difference, for which reason the amount of the shift is extremely small. The internal pressure of the chamber is maintained high, for example at not less than 1E-4 Torr. The maximum partial pressure of the out gas from the resist over the semiconductor wafer is 1E-5Torr, which corresponds to about 10% of the partial pressure of the inert gas. Namely, the partial pressure of the out gas is not more than 10%, for which reason it is unnecessary to find the correction coefficient C every times even the kinds of ion, the beam current, the ion-implantation energy and the resist material are different every times.

In order to maintain the internal pressure of the chamber at not less than 1E-4, the inert gas is supplied into the chamber. For example, argon and xenon are available. The inert gas is supplied so that the internal pressure of the chamber is maintained depending on the amount of the shift of the ion-beam or on the amount of the out-gas from the resist over the semiconductor wafer. The maximum internal pressure of the chamber may be much higher than the minimum internal pressure, for example, may be about 1E-1 Torr.

PREFERRED EMBODIMENT

Figure 2:
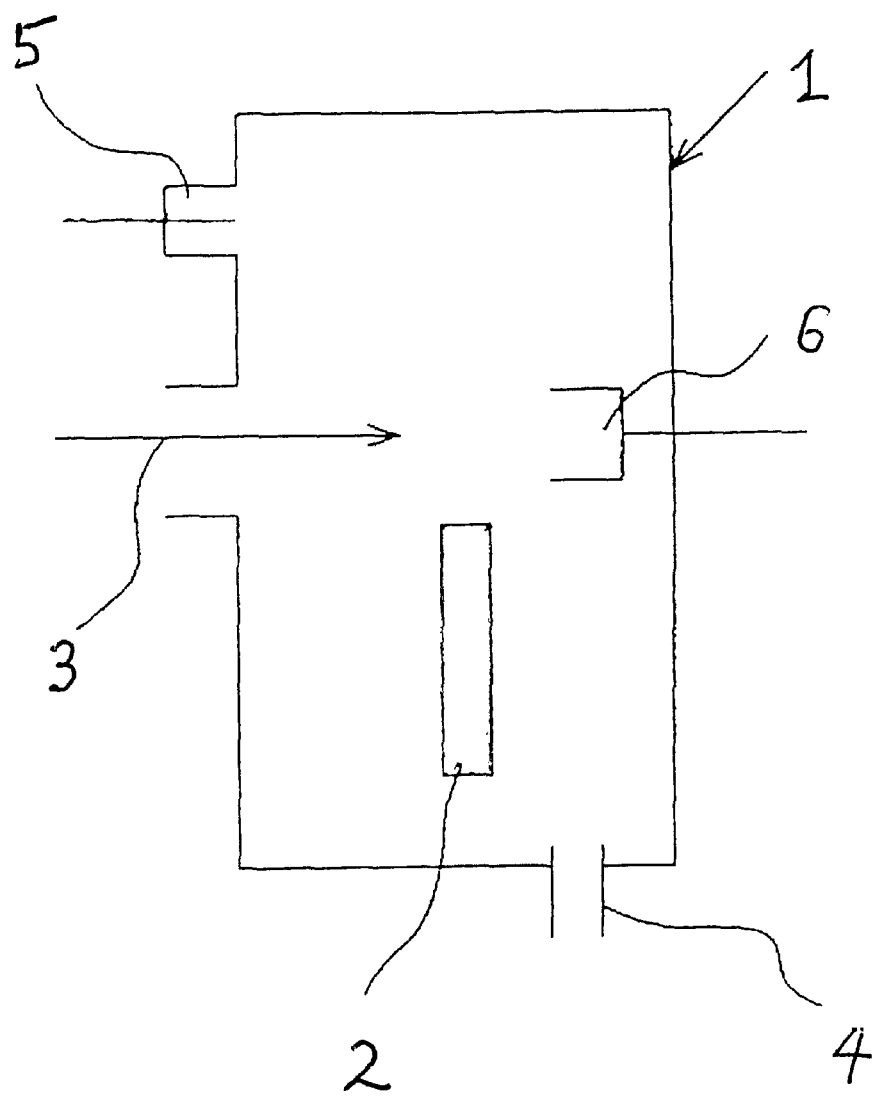
FIG. 2 is a schematic cross sectional view illustrative of a novel ion-implantation apparatus in a first embodiment in accordance with the preset invention.

A first embodiment according to the present invention will be described in detail with reference to the drawings. FIG. 2 is a schematic cross sectional view illustrative of a novel ion-implantation apparatus in a first embodiment in accordance with the preset invention. The novel ion-implantation apparatus has the following elements. A chamber 1 is provided which accommodates a semiconductor wafer 2 over which a resist is provided. A pressure gage 5 is also provided on the chamber 1 for measuring an internal pressure of the chamber 1. A dose counter 6 is also provided in the chamber 1 for receiving an ion-beam 3 and measuring a dose of the ion-beam 3. Further, an inert gas supplying tube 4 is provided on the chamber for supplying the inert gas into the chamber 1, so that the internal pressure of the chamber is maintained at not less than 1E-4 Torr. For example, if the ion-implantation is carried out to the resist-free semiconductor wafer, then the internal pressure of the chamber is maintained at 1.01E-4 Torr. If the ion-implantation is carried out to the semiconductor wafer provided with the resist, then the internal pressure of the chamber is maintained at 1.1E-4Torr. A difference in the internal pressure of the chamber between when the ion-implantation is carried out to the resist-free semiconductor wafer and when the ion-implantation is carried out to the semiconductor wafer provided with the resist is extremely small, for example, 0.1E-4 or about 0.1 times. The shift is to compensate this difference, for which reason the amount of the shift is extremely small The internal pressure of the chamber is maintained high, for example at not less than 1E-4 Torr. The maximum partial pressure of the out gas from the resist over the semiconductor wafer is 1E-5Torr, which corresponds to about 10% of the partial pressure of the inert gas. Namely, the partial pressure of the out gas is not more than 10%, for which reason it is unnecessary to find the correction coefficient C every times even the kinds of ion, the beam current, the ion-implantation energy and the resist material are different every times.

In order to maintain the internal pressure of the chamber at not less than 1E-4, the inert gas is supplied into the chamber. For example, argon and xenon are available. The inert gas is supplied so that the internal pressure of the chamber is maintained depending on the amount of the shift of the ion-beam or on the amount of the out-gas from the resist over the semiconductor wafer The maximum internal pressure of the chamber may be much higher than the minimum internal pressure, for example, may be about 1E-1 Torr.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. An ion-implantation apparatus comprising:
   a chamber; and
   a pressure controller for maintaining an internal pressure of said chamber at not less than 1E-4 Torr during an ion-implantation process.

2. The ion-implantation apparatus as claimed in claim 1, wherein the pressure controller maintains the internal pressure in the range of 1E-4 Torr to 1E-1 Torr.

3. The ion-implantation apparatus as claimed in claim 1, wherein said pressure controller further comprises:
   a pressure gage for measuring the internal pressure; and
   an inert gas supplying system for supplying an inert gas into the chamber as a function of a partial pressure of an out gas.

4. An ion-implantation apparatus comprising:
   a chamber;
   a dose counter for measuring a dose of an ion-beam;
   a pressure gage for measuring an internal pressure of said chamber; and
   an inert gas supplying system for supplying an inert gas into said chamber so as to maintain an internal pressure of said chamber in the range of 1E-4 Torr to 1E-1 Torr during an ion-implantation process and to maintain a partial pressure of an out gas at no more than about 10% of a partial pressure of the inert gas.

5. A method of ion-implantation by maintaining an internal pressure of a chamber at not less than 1E-4 Torr during an ion-implantation process by introducing an inert gas into the chamber to control a partial pressure of an out gas to be no more than 10% of a partial pressure of the inert gas.

6. The method as claimed in claim 5, wherein the internal pressure is maintained in the range of 1E-4 Torr to 1E-1 Torr.

7. The method as claimed in claim 5, wherein the inert gas is supplied into the chamber to maintain said internal pressure at not less than 1E-4 Torr.

8. The method as claimed in claim 5, wherein, when ion-implanting a wafer with a resist, the internal pressure of the chamber is set for a value within 10% greater than the internal pressure of the chamber used for a same-type wafer without resist.

* * * * *